United States Patent [19] [11] Patent Number: 5,541,127
Hoshiko et al. [45] Date of Patent: Jul. 30, 1996

[54] MANUFACTURING METHOD OF SIDEWALL INSULATING FILM

[75] Inventors: Takahiro Hoshiko; Toshiaki Ogawa, both of Hyogo-ken, Japan

[73] Assignee: Mitsubishi Denki Kabushiki Kaisha, Tokyo, Japan

[21] Appl. No.: 440,614

[22] Filed: May 15, 1995

Related U.S. Application Data

[62] Division of Ser. No. 248,561, May 24, 1994, Pat. No. 5,432,367, which is a continuation of Ser. No. 866,585, Apr. 10, 1992, abandoned.

[30] Foreign Application Priority Data

Apr. 17, 1991 [JP] Japan .................................. 3-85487

[51] Int. Cl.⁶ .................................................. H01L 21/311
[52] U.S. Cl. ............................ 437/41; 437/228; 437/947; 437/981; 437/983; 148/DIG. 161
[58] Field of Search .......................... 437/40 SW, 40 GS, 437/41 SW, 41 GS, 947, 981, 983, 228 M; 148/DIG. 103, DIG. 161, DIG. 15

[56] References Cited

U.S. PATENT DOCUMENTS

| | | |
|---|---|---|
| 4,577,391 | 3/1986 | Hsia et al. . |
| 4,729,002 | 3/1988 | Yamazaki . |
| 4,736,233 | 4/1988 | McDavid . |
| 4,745,086 | 5/1988 | Parrillo et al. . |
| 4,752,589 | 6/1988 | Schalier . |
| 4,826,781 | 5/1989 | Asahina et al. . |
| 4,878,100 | 10/1989 | McDavid . |
| 4,998,150 | 3/1991 | Rodder et al. . |
| 5,053,849 | 10/1991 | Izawa et al. ...................... 437/41 GS |
| 5,170,232 | 12/1992 | Narita . |
| 5,173,752 | 12/1992 | Motonami et al. . |
| 5,177,570 | 1/1993 | Tanaka . |

FOREIGN PATENT DOCUMENTS

| | | |
|---|---|---|
| 0388075 | 3/1990 | European Pat. Off. . |
| 4001372 | 1/1990 | Germany . |
| 57-199223 | 2/1983 | Japan . |
| 58-220428 | 12/1983 | Japan ................................. 437/947 |
| 61-287246 | 12/1986 | Japan ................................. 437/981 |
| 62-145744 | 6/1987 | Japan ................................. 437/947 |
| 63-81926 | 8/1988 | Japan . |
| 1-20641 | 1/1989 | Japan ................................. 437/947 |
| 63-258021 | 2/1989 | Japan . |
| 1-55855 | 3/1989 | Japan . |
| 1-66940 | 6/1989 | Japan . |
| 1-201940 | 8/1989 | Japan . |

(List continued on next page.)

OTHER PUBLICATIONS

S. Wolf & R. N. Tauber "Silicon Processing For the VLSI EVA" vol. I, 1986, p. 198.
S. Wolf, "Silicon Processing For the VLSI EVA" vol. II, 1990, pp. 354–357.

*Primary Examiner*—Tom Thomas
*Assistant Examiner*—Leon Radomsky
*Attorney, Agent, or Firm*—Lowe, Price, LeBlanc & Becker

[57] ABSTRACT

Disclosed are a semiconductor device having a sidewall insulating film free from the formation of fence-shaped residue when a conductive layer formed on the sidewall insulating film is anisotropically etched by means of plasma etching, and a method of forming the sidewall insulating film. The method of forming the sidewall insulating film includes the steps of isotropically etching an insulating film 4 formed on a polycrystalline silicon film 3 to be a gate electrode as much as a prescribed thickness, using resist as a mask, anisotropically etching the remaining part of insulating film 4 and polycrystalline silicon film 3, forming an insulating film 6 entirely over the surface, and forming a sidewall insulating film 6a on the side plane of polycrystalline silicon film 3. The resultant sidewall insulating film 6a has a cross-section reduced upwardly in width. A polycrystalline silicon film 7 formed on sidewall insulating film 6a will not have a surface in the vertical direction relative to a semiconductor substrate 1. Consequently, the disconnection of an upper layer interconnection can be effectively prevented, and miniaturization of elements can be achieved without forming fence-shaped residue, when polycrystalline silicon film 7 is anisotropically etched (plasma etching).

6 Claims, 10 Drawing Sheets

U.S. PATENT DOCUMENTS

| | | | |
|---|---|---|---|
| 1-222448 | 9/1989 | Japan | 437/41 GS |
| 1-222448 | 12/1989 | Japan . | |
| 1-239932 | 12/1989 | Japan . | |
| 2-54960 | 2/1990 | Japan . | |
| 2-58836 | 2/1990 | Japan | 437/947 |
| 4-74422 | 3/1992 | Japan | 437/981 |

FIG. 15
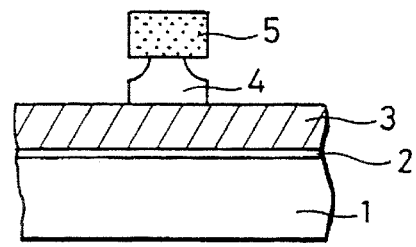
FIG. 16
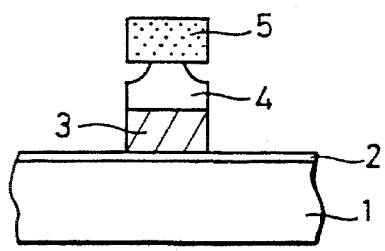
FIG. 17          PRIOR ART
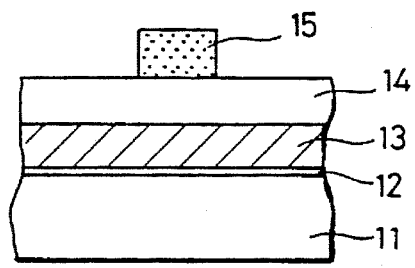
FIG. 18          PRIOR ART
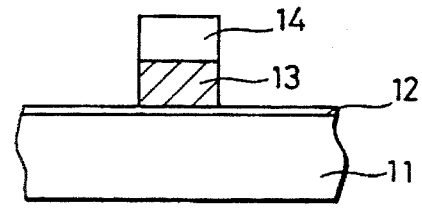

5,541,127

MANUFACTURING METHOD OF SIDEWALL INSULATING FILM

This application is a division of application Ser. No. 08/248,561 filed May 24, 1994 now U.S. Pat. No. 5,432,367 which is a continuation of application Ser. No. 07/866,585 filed Apr. 10, 1992 abandoned.

BACKGROUND OF THE INVENTION

1. Field of the Invention

The present invention relates generally to a semiconductor device and a manufacturing method thereof, and more specifically, to a semiconductor device having sidewall insulating films and a method of forming the sidewall insulating films.

b 2. Description of the Background Art

Conventionally, a sidewall insulating film is known, which is formed for the purpose of insulation on a sidewall of a gate electrode in, for example, a MOS transistor. The sidewall insulating film is formed by anisotropic etching by means of atmospheric plasma etching.

FIGS. 17 to 27 are sectional views for illustrating a manufacturing process of a semiconductor device (a MOS transistor) having a conventional sidewall insulating film. The manufacturing process of the semiconductor device will be described in conjunction with FIGS. 17 to 27.

As in FIG. 17, a gate insulating film 12 formed of a silicon oxide film is formed on a semiconductor substrate 11. After a polycrystalline silicon film 13 is formed means of chemical vapor deposition, an insulating film 14 formed of a silicon oxide film is formed. A resist layer 15 is formed in a prescribed region on insulating film 14.

As shown in FIG. 18, insulating film 14 and polycrystalline silicon film 13 are anisotropically etched using resist layer 15 as a mask. Anisotropic etching is characterized in that lateral component is sufficiently smaller relative to vertical component as etching proceeds. A conventional plasma etching is known as one among the anisotropic etchings. The plasma etching takes advantage of chemical reactions in the interface between vapor and solid phases to remove unnecessary part of a thin film or a substrate. Among known plasma etching methods, some use $CHF_3/O_2$ gas plasma, and others use $HBr/Cl_2$ gas plasma.

As shown in FIG. 19, impurity ions are implanted into a semiconductor substrate 11 using the patterned polycrystalline silicon film 13 and insulating film 14 as masks, thereby forming a low-concentration impurity region 19.

Now, as in FIG. 20, an insulting film 16 of a silicon oxide film is formed on the entire surface.

As shown in FIG. 21, insulating film 16 is anisotropically etched to form a sidewall insulating film 16a. Impurity ions are implanted into semiconductor substrate 11 using sidewall insulating film 16a and insulating film 14 as masks. A high-concentration impurity region 20 is thus formed. The impurity regions (19, 20) having an LDD (Lightly Doped Drain) structure are thus formed. Polycrystalline silicon film 13 corresponds to a gate electrode in an MOS transistor. In other words, an MOS transistor is formed of polycrystalline silicon film 13 (gate electrode) and the pair of impurity regions (19, 20).

As shown in FIG. 22, a polycrystalline silicon film 17 is formed covering high-concentration impurity region 20, sidewall insulating film 16a and insulating film 14. A resist layer 18 is formed in a prescribed region on polysilicon film 17.

Now, as set forth in FIG. 23, polysilicon film 17 is anisotropically etched by means of plasma etching, using resist film 18 as a mask. The plasma etching performed on polysilicon film 17 is the competitive reaction of etching (protective film removal) and deposition (protective film formation). In other words, a protective film is formed on the surface of polysilicon film 17 at the time of plasma etching. The protective film is removed by ions injected in an approximately vertical direction relative to semiconductor substrate 11. The competitive reaction between such protective film formation and protective film removal causes polycrystalline silicon film 17 to be anisotropically etched (plasma etching).

Now, the principles of forming a sidewall protective film 201a formed at the time of plasma etching will be described. These are disclosed in, for example, in a series of manuscripts prepared for the 34th semiconductor special study seminar held from Jul., 28 to 31, 1990, pp 120–124. FIGS. 28 and 29 are sectional views for illustrating the principles of forming sidewall protective film 201a by plasma etching. A sidewall protective film $201a_1$ shown in FIG. 28 originates in resist 18 and a sidewall protective film $201a_2$ shown in FIG. 29 originates in etching gas.

Referring to FIG. 28, sidewall protective film $201a_1$ is formed of a film of polymer containing carbons. In other words, in the process of plasma etching, besides polycrystalline silicon film 17 is etched, resist 18 is decomposed by the injection of ions formed in plasma. The decomposition of resist 18 causes the reaction product of polymer containing carbons to be deposited on the surfaces of resist 18 and polycrystalline silicon film 17. Among the deposited reaction product, the part of the reaction product formed on the surface 17a of polycrystalline silicon film 17 and the surface 18a of resist 18 is removed by the injection of ions. Sidewall protective film $201a_1$ formed on the sidewall 18b of resist 18 and the sidewall 17b of polycrystalline silicon film 17, however, being formed in the direction parallel to the direction of ion injection, is less subject to the impinging ions compared to the surface 17a of polycrystalline silicon film 17. Sidewall protective film $201a_1$ will remain on the sidewall 18b of resist 18 and the sidewall 17b of polycrystalline silicon film 17.

Referring to FIG. 29, sidewall protective film $201a_2$ originates in etching gas. In other words, an oxide film is formed on the surface 17a and sidewall 17b of polycrystalline silicon film 17, if $O_2$ is added to polycrystalline silicon film 17, together with $Cl_2$ which is effective as an etching gas. An oxide film (not shown) is formed on the surface 18a and sidewall 18b of resist 18. The oxide film constitutes sidewall protective film $201a_2$. Protective films (not shown) on the surface 17a of polycrystalline silicon film 17 and the surface 18a of resist 18 are removed by ions in a similar manner as shown in FIG. 28.

Sidewall protective films $201a_1$ and $201a_2$ are thus formed in the part parallel to the direction of ions injected upon plasma etching.

Referring back to FIG. 23, a sidewall protective film 201a is formed on the sidewalls of polycrystalline silicon film 17 and resist 18. Formed on the remaining surface region of polycrystalline silicon film 17 are surface protective films 201d, 201e and a sidewall protective film 201b. A sidewall protective film 201c is formed on the other sidewall (vertical portion) of resist 18. As plasma etching proceeds in this state, surface protecting films 201d and 201e formed in the regions parallel to semiconductor substrate 11 are removed by the injection of ions 30. As the etching further proceeds, the state shown in FIG. 24 is obtained and finally the state shown in FIG. 25 is created. Referring to FIG. 25, a part of sidewall protective film 201a still remains on the sidewalls of polycrystalline silicon film and resist 18. Also, a part of sidewall protective film 201c still remains on the other sidewall (vertical portion) of resist 18. A fence-shaped residue 202 remains on high-concentration impurity region 20 to which polycrystalline silicon film 17 is not connected. FIG. 30 is an enlarged view showing a part of the fence-shaped residue shown in FIG. 25. Referring to FIG. 30, fence-shaped residue 202 is formed of polycrystalline film 17a, and a protective film 201b formed covering polycrystalline silicon film 17a.

After the step shown in FIG. 25, resist 18 (see FIG. 25) is removed as shown in FIG. 26.

An insulating film 61 is formed covering polycrystalline silicon film 17 as shown in FIG. 27. A polycrystalline film 62 is formed in connection with high-concentration impurity region 20. Polycrystalline silicon film 62 constitutes an electrode interconnection layer of an MOS transistor as polycrystalline silicon film 17. This is the way conventional MOS transistors are formed.

In a conventional manner as described above, fence-shaped residue 202 see FIG. 26) is produced on high-concentration impurity region 20 when anisotropic etching by means of plasma etching is performed onto polycrystalline silicon film 17 which corresponds to an electrode interconnection layer. The formation of polycrystalline silicon film 62 corresponding to the electrode interconnection layer in such a state causes polycrystalline silicon film 62 to be disconnected on the top of fence-shaped residue 202 as shown in FIG. 27. Fence-shaped residue 202 is also hinderance to miniaturization. In other words, polycrystalline silicon film 62 should be formed in a region free form the formation of fence-shaped residue 202. It is also necessary to secure a prescribed contact area between polycrystalline silicon film 62 and high-concentration impurity region 20. The surface area of high-concentration impurity region 20 to be connected to polycrystalline silicon film 62 must be large enough, and, therefore, high-density integration can not be achieved as a result.

SUMMARY OF THE INVENTION

It is therefore an object of the present invention to prevent effectively the formation of fence-shaped residue when a conductive layer formed on a sidewall insulating film is anisotropically etched using plasma etching, in a manufacturing method of a semiconductor device.

Another object of the present invention is to form a sidewall insulating film in such a manner that the sidewall insulating film of a conductive layer will not have a surface in a direction approximately vertical relative to a semiconductor substrate in a manufacturing method of a semiconductor device.

A further object of the present invention is to prevent the disconnection of an upper layer interconnection layer.

Yet another object of the present invention is to achieve the miniaturization of elements in a semiconductor device.

In accordance with one aspect of the present invention, a method of forming a sidewall-insulating film includes the steps of forming a conductive layer on a semiconductor substrate, forming a first insulating layer on the conductive layer, forming a patterned mask layer a prescribed region on the first insulating layer, isotropically etching the first insulating layer as much as predetermined using the mask layer as a mask, exposing the conductive layer by anisotropically etching the first insulating layer using the mask layer as a mask, anisotropically etching the conductive layer using the mask layer or the patterned first insulating layer as a mask, removing the mask layer, forming a second insulating layer on a sidewall of the conductive layer and on the first insulating layer on the semiconductor substrate, and leaving a part of the sidewall film on the sidewall of the conductive layer by anisotropically etching the second insulating layer.

In operation, the first insulating layer is isotropically etched as much as predetermined, the second insulating layer formed on the first insulating layer is anisotropically etched to leave the sidewall insulating film on the sidewall of the conductive layer, and, therefore, the sidewall insulating film is formed with its width tapered upwardly. The conductive layer thus attains a shape without a surface approximately vertical to the semiconductor substrate.

In accordance with another aspect of the present invention, a semiconductor device includes a semiconductor substrate, a conductive layer formed on the semiconductor substrate with an insulating film therebetween, and an insulating film formed surrounding the both sidewalls and the top of the conductive layer. The insulating film includes a top contour line extending parallel relative to the top of the conductive layer, a first side contour line extending inclined from one end of the top contour line to the main surface of the semiconductor substrate, and a second side contour line extending inclined from the other end of the top contour line to the main surface of the semiconductor substrate. A spacing of the first and second side contour lines is formed to gradually decrease from the main surface of the semiconductor substrate toward the vicinity of the top contour line.

In operation, the spacing of the first and second sidewall contour lines of the insulating film gradually decreases from the main surface of the semiconductor substrate toward the vicinity of the top contour line, and, therefore, no fence-shaped residue is produced when anisotropic etching (plasma etching) is performed to form a conductive layer on the insulating film.

The foregoing and other objects, features, aspects and advantages of the present invention will become more apparent from the following detailed description of the present invention when taken in conjunction with the accompanying drawings.

BRIEF DESCRIPTION OF THE DRAWINGS

FIGS. 15 and 16 are sectional views for illustrating a manufacturing process of a semiconductor device in accordance with another embodiment of the present invention;

FIGS. 17 to 27 are sectional views for illustrating a conventional manufacturing process of a semiconductor device;

DESCRIPTION OF THE PREFERRED EMBODIMENTS

Now, description will be provided on the preferred embodiments of the present invention in conjunction with the drawings.

Referring to FIGS. 1 to 14, a manufacturing process of a semiconductor device (MOS transistor) in accordance with one embodiment of the present invention will be described.

Figure 1:
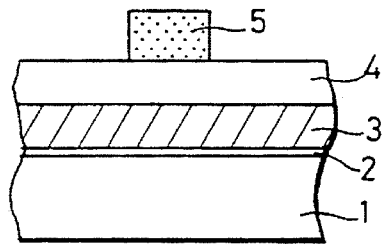
FIGS. 1 to 14 are sectional views for illustrating a manufacturing process of a semiconductor device in accordance with one embodiment of the present invention.

As shown in FIG. 1, a gate insulating film 2 is formed on a semiconductor substrate 1. After a polycrystalline silicon film 3 is formed by chemical vapor deposition, an insulating film 4 formed of a silicon oxide film is formed. A resist 5 is formed in a prescribed region on the insulating film 4. Gate insulating film 2 is in the range of 100 to 300Å in thickness, polycrystalline silicon film 3 is in the range of 1500 to 2500Å in thickness, and insulating film 4 is in the range of 1500 to 2500Å in thickness.

Figure 2:
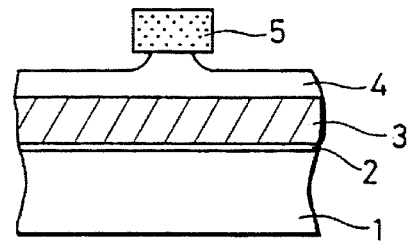

As shown in FIG. 2, isotropic etching is performed using resist 5 as a mask until insulating film 4 becomes about ⅕ to ½ as thick. The etching is carried out by soaking the substrate including insulating film into about 2% aqueous solution of hydrofluoric acid.

Figure 3:
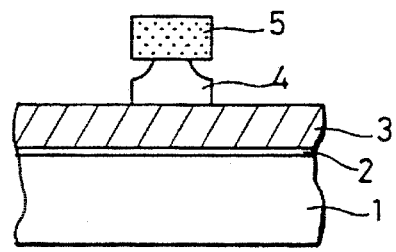

As in FIG. 3, the remaining part of insulating film 4 is anisotropically etched (plasma etching) using resist 5 as a mask. The anisotropic etching is performed using reactive ion etching in $CHF_3/O_2$ gas plasma.

Figure 4:
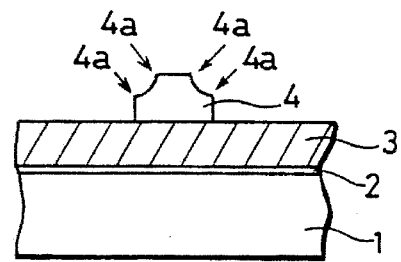

Resist 5 is then removed as shown in FIG. 4.

Figure 5:
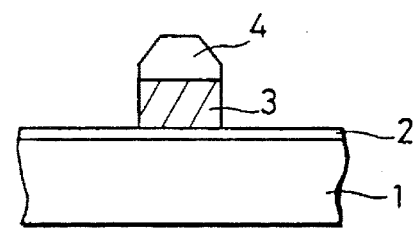

As in FIG. 5, polysilicon film 3 is anisotropically etched (plasma etching) using insulating film 4 as a mask. The anisotropic etching is Carried out using reactive ion etching in $HBr/Cl_2$ gas plasma. The top side end of insulating film 4 attains a linear sectional form compared to the top side end of insulating film 4 shown in FIG. 4 shown in FIG. 4. This is because the edge 4a of insulating film 4 shown in FIG. 4 is removed by the anisotropic etching.

Figure 6:
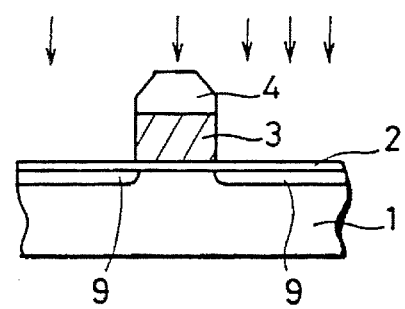

As shown in FIG. 6, impurity ions are implanted into semiconductor substrate 1 using polycrystalline silicon film 3 and insulating film 4 as masks.

Figure 7:
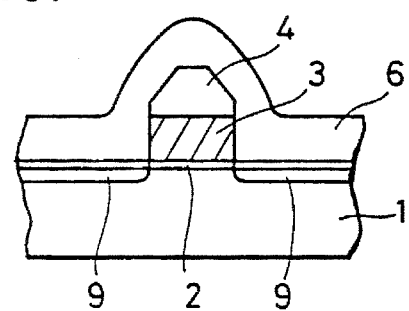

Referring to FIG. 7, an insulating film 6 formed of a silicon oxide film is formed entirely over the surface. The thickness of the insulating film is in the range of 1500 to 4000Å.

Figure 8:
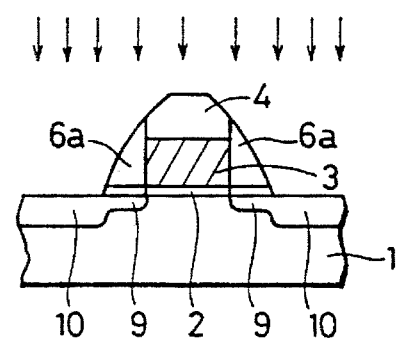

Referring to FIG. 8, a sidewall insulating film 6a is formed by anisotropically etching insulating film 6 (see FIG. 7). Unlike the conventional one, the shape in section of the sidewall insulating film does not have a sectional form in the direction vertical relative to the semiconductor substrate 1. In other words, the width of the sidewall insulating film 6a is reduced upwardly. The width of the part of sidewall insulating film 6a in contact with semiconductor substrate 1 is in the range of 1500 to 4.000Å. The minimum thickness of sidewall insulating film 6a at the upper edge of polycrystalline silicon film 3 is between 750 and 1250Å. The anisotropic etching is performed by means of reactive ion etching in $CHF_3/O_2$ gas plasma. Impurity ions are implanted into semiconductor substrate 1 using insulating film 4 and sidewall insulating film 6a as masks. A high-concentration impurity region 10 is thus formed.

Figure 9:
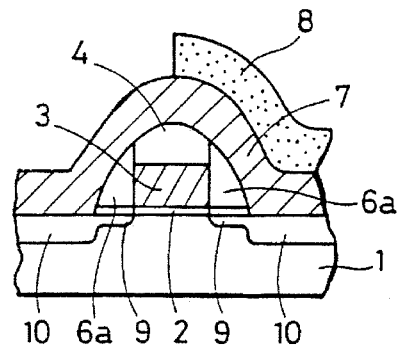
Figure 22:
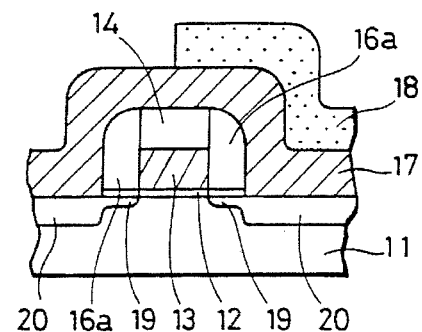
Figure 23:
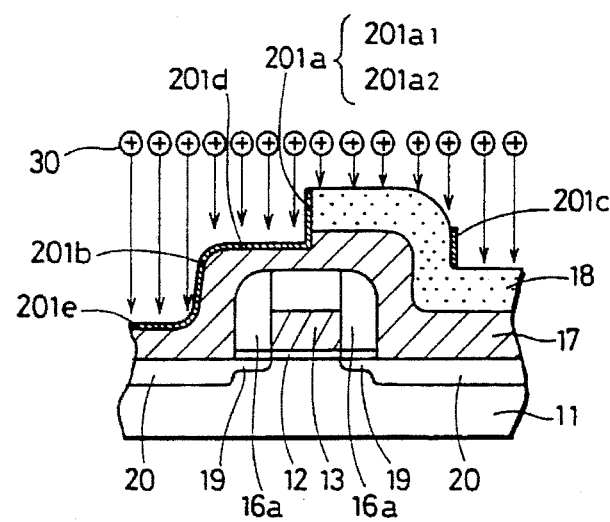
Figure 24:
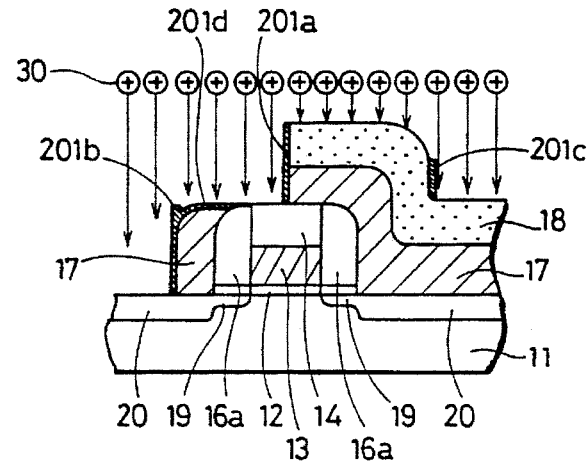
Figure 25:
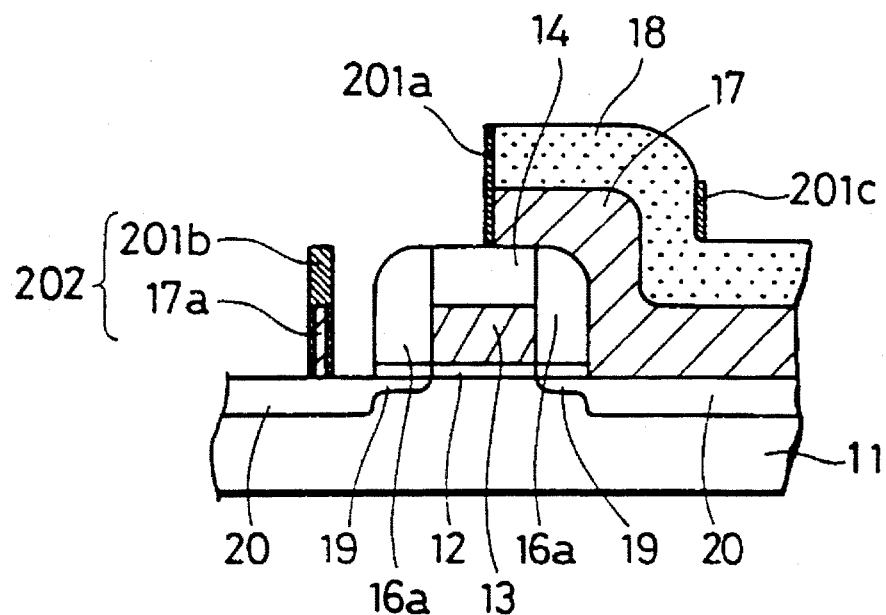
Figure 26:
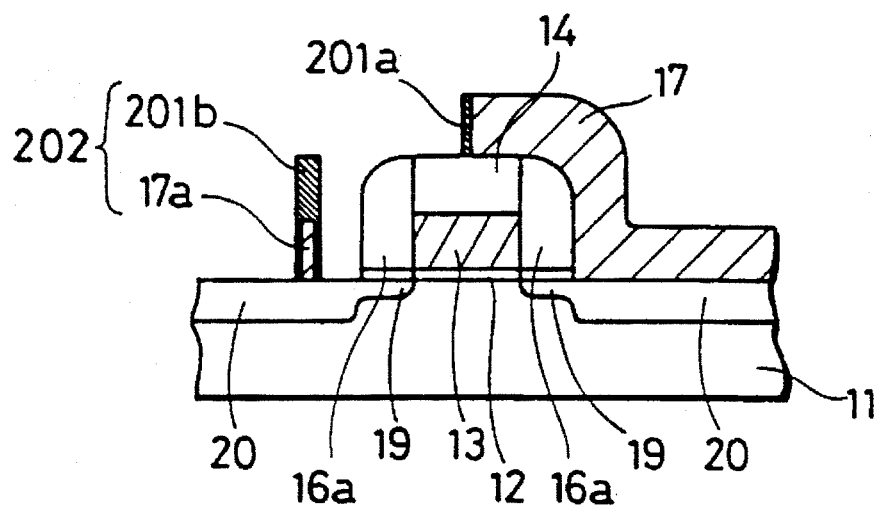
Figure 27:
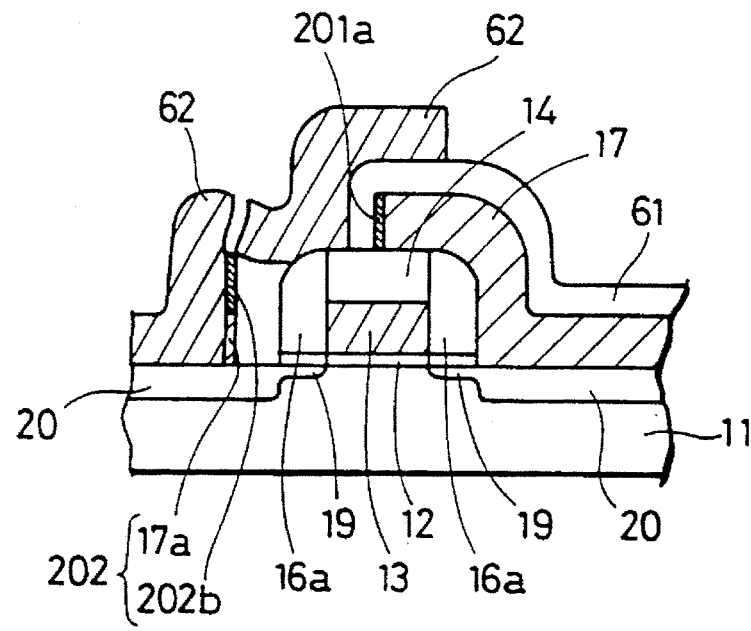
Figure 28:
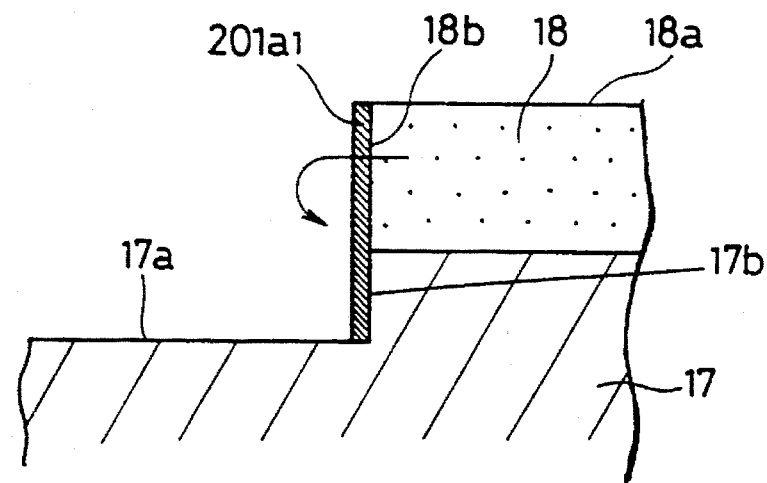
FIGS. 28 and 29 are sectional views each for illustrating the principle of forming a side wall protective film by means of plasma etching.
Figure 29:
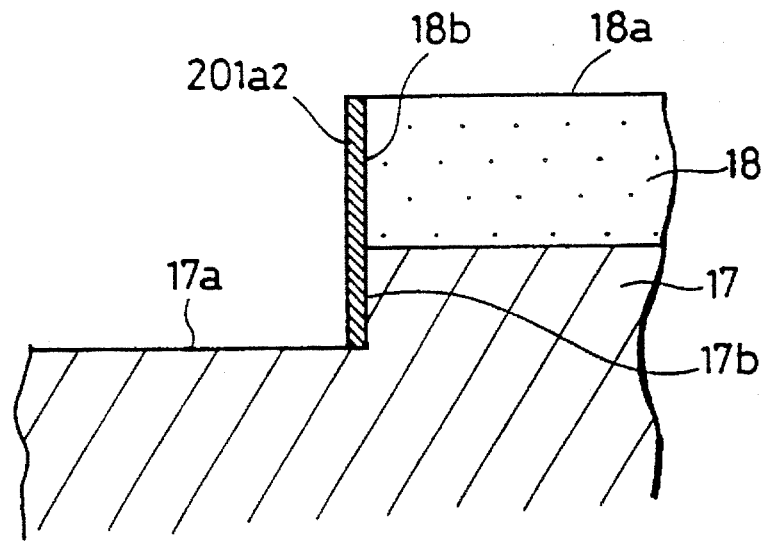
Figure 30:
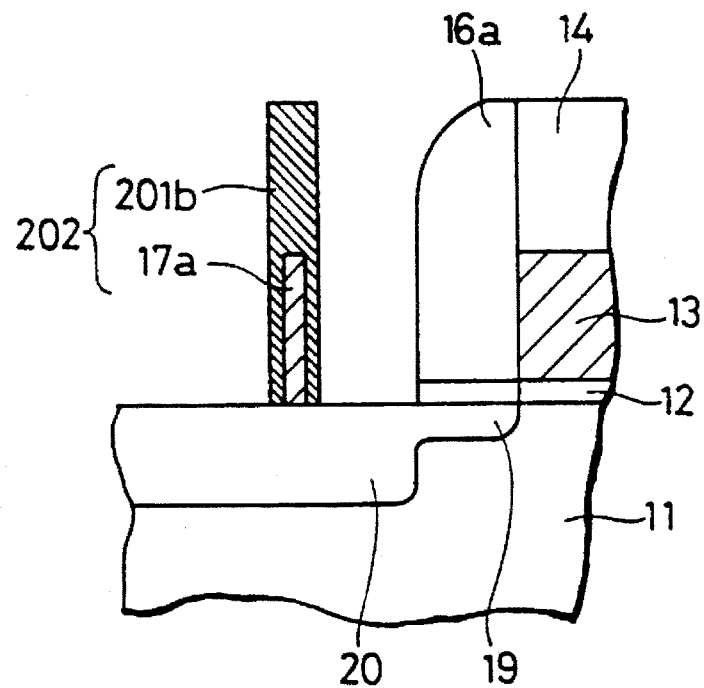
FIG. 30 is a partial enlarged view showing the fence-shaped residue shown in FIG. 27.

As in FIG. 9, a polycrystalline silicon film 7 is formed entirely over the surface. Resist 8 is formed in a prescribed region on polycrystalline silicon film 7. Polycrystalline: silicon film 7 formed covering sidewall insulating film 6a and insulating film 4 has a section similar to sidewall insulating film 6a and insulating film 4. In other words, the form of polycrystalline silicon film 7 in section does not have a section in the vertical direction relative to the semiconductor substrate, unlike polycrystalline silicon film 17 shown in FIG. 22, but takes a gently inclined shape.

Figure 10:
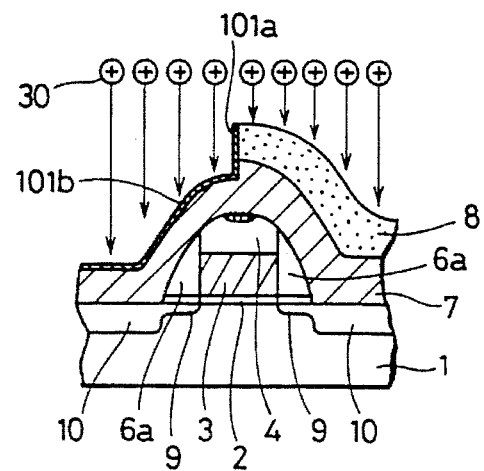
Figure 11:
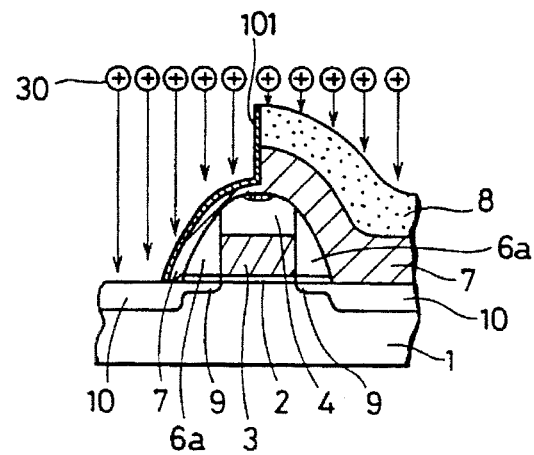
Figure 12:
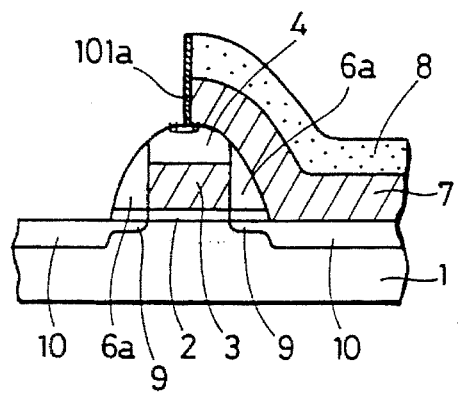

As in FIG. 10, polycrystalline silicon film 7 is anisotropically etched using resist 8 as a mask. The anisotropic etching is carried out by means of reactive ion etching in $HBr/Cl_2$ gas plasma. The section in the vertical direction relative to semiconductor substrate 1 is formed only on the sidewall of polycrystalline silicon 7 under the sidewall of resist 8. In other words, a protector film 101b formed on the surface of polycrystalline silicon 7 other than the above-described part will be removed by ions 30. As the anisotropic etching of polycrystalline silicon film 7 proceeds, a sectional shape shown in FIG. 11 is produced. Finally as shown in FIG. 12, sidewall protective film 101a remains only on the sidewalls of polycrystalline silicon film 7 and resist 8. As described above, in accordance with the preferred embodiment, unlike the conventional one, no fence-shaped residue is formed on high-concentration impurity region 10 on the side to which polycrystalline silicon film is not connected.

Figure 13:
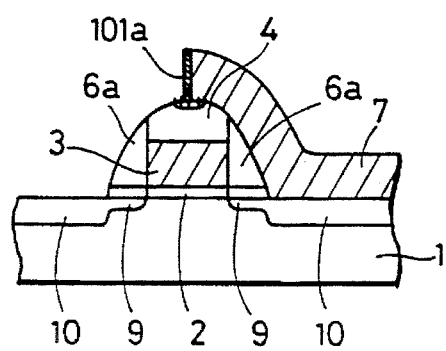

Then, resist 8 is removed as shown in FIG. 13.

Figure 14:
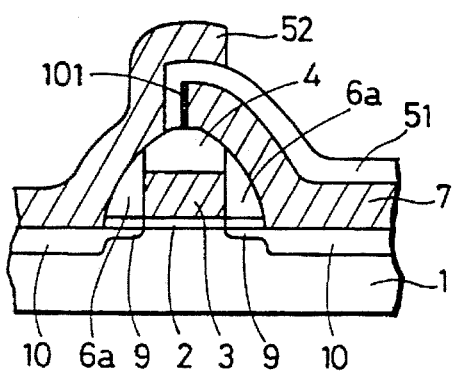
Figure 19:
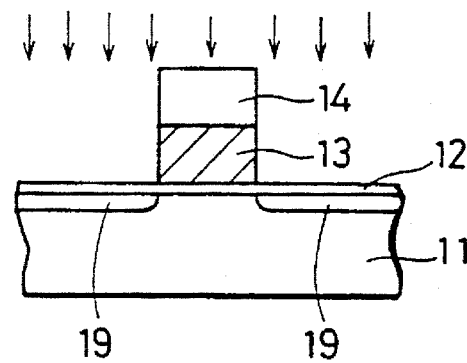
Figure 20:
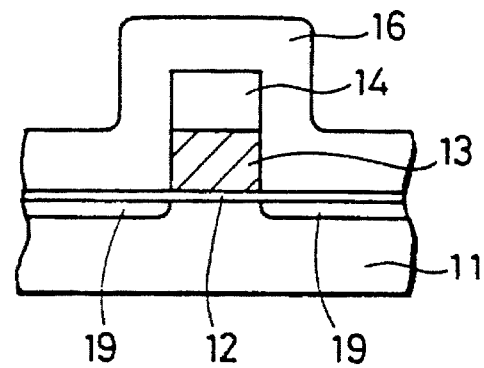
Figure 21:
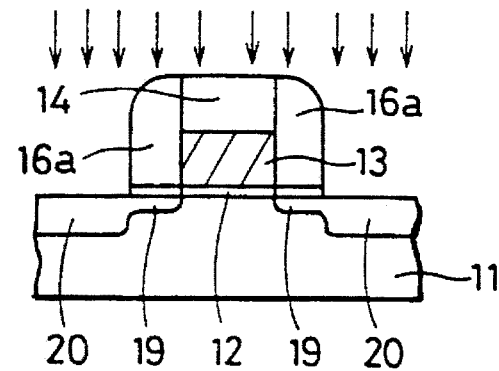

Referring to FIG. 14, an insulating film 51 covering polycrystalline silicon film 7 is formed. A polycrystalline silicon film 52 is formed in connection with high-concentration impurity region 10 on the side to which polycrystalline silicon film 7 is not connected. Polycrystalline silicon film 3 corresponds to the gate electrode of an MOS transistor. An MOS transistor is formed of a pair of impurity regions (9, 10), a gate insulating film 2, and a polycrystalline silicon film 3. Polycrystalline silicon films 7 and 52 correspond to the electrode interconnection layers of the MOS transistor. Referring to FIG. 14, in the preferred embodiment, no fence-shaped residue is produced unlike the conventional one, polycrystalline silicon film 52 will not be disconnected. The area of contact between high-concentration impurity region 10 and polycrystalline silicon film 52 is not reduced by the formation of fence shaped residue, and, therefore, it is not necessary to increase high-concentration impurity region 10 as practiced in the conventional method. Higher-density integration than the conventional one can thus be achieved. Referring to FIG. 15 and 16, another embodiment of the present invention represents another embodiment of the process shown in FIGS. 3 to 5 among the first embodiment shown in FIGS. 1 to 14. As in FIG. 15, anisotropic etching is performed using resist 5 as a mask. This step is identical to that shown in FIG. 3. As shown in FIG. 16, polycrystalline silicon film 3 is further anisotropically etched using resist 5 as a mask. Then, after the removal of resist 5, the shape similar to the one shown in FIG. 5 is produced. The upper sidewall of insulating film 4 does not take an inclined linear shape as shown in FIG. 5 in this embodiment, but remains in a curved shape as in FIG. 16. This is because anisotropic etching using insulating film 4 as a mask as shown in FIG. 4 is not performed, and the edge 4a of insulating film 4 (see FIG. 16) is not removed.

Although in the preferred embodiment, polycrystalline silicon films (3, 7) are Used as the gate electrode and electrode layer of the MOS transistor, the present invention is by no means limited thereto, a two-layered structure formed of silicide such as $WSi_2$ and polycrystalline silicon may be used. Although in the anisotropic etching performed in the step shown in FIG. 2 in the preferred embodiment, the substrate including the insulating film are soaked into about 2% hydrofluoric acid aqueous solution, the present invention is by no means limited thereto, and $NF_3$ or $CF_4$ gas may be used.

As described above, in the preferred embodiment, the sidewall insulating film 6a of the gate electrode (polycrystalline silicon film 3) is formed to taper. Unlike the conventional methods, no vertical stepped portion is produced if polycrystalline silicon film 7 is formed covering the sidewall insulating film 6a. No fence-shaped residue is therefore formed by anisotropically etching polycrystalline silicon film 7. Consequently, no disconnection takes place in forming upper layer interconnections, resulting in further miniaturization of elements.

As in the foregoing, in the method of forming a sidewall insulating film in accordance with the present invention, the first insulating layer formed on the conductive layer is anisotropically etched as much as predetermined, the second insulating layer is formed on the first insulating layer, and the sidewall insulating film is left on the side of the conductive layer by anisotropically etching the second insulating film. Thus, the sidewall insulating film is formed with its width reduced upwardly. Consequently, when a conductive layer is formed on the sidewall insulating film, the conductive layer takes a shape without a surface in the vertical direction relative to the semiconductor substrate. The formation of fence-shaped residue is thus effectively prevented at the time of plasma etching.

Also in a semiconductor device in accordance with the present invention, the spacing of the first and second contour lines of an insulating film formed surrounding both sides and top of a conductive layer is formed to gradually decrease from the main surface of the semiconductor substrate to the top contour line. Therefore, no fence-shaped residue is formed when a conductive layer is formed on the insulating film and anisotropic etching is performed thereon. Consequently, the further miniaturization of elements than practiced by the conventional methods can be achieved.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of forming a sidewall insulating film, comprising the steps of:

forming a conductive layer on a semiconductor substrate;

forming a first insulating layer on said conductive layer;

forming a patterned mask layer in a region on said first insulating layer;

isotopically etching the first insulating layer until it is generally a first thickness, using said mask layer as a mask;

exposing said conductive layer by anisotropically etching said first insulating layer, using said mask layer as a mask;

anisotropically etching said conductive layer, using said mask layer or said patterned first insulating layer as a mask;

removing said mask layer;

forming a second insulating layer on the said plane of said conductive layer and on said first insulating layer on said semiconductor substrate; and leaving a sidewall insulating film on the side plane of said conductive layer by anisotropically etching said second insulating layer.

2. A method of forming a sidewall insulating film as recited in claim 1, wherein said first thickness is in the range of ⅕ to ½ the thickness of said first insulating layer.

3. A method of forming a sidewall insulating film as recited in claim 1, wherein said semiconductor substrate includes a thin insulating film on its main surface.

4. A method of forming a sidewall insulating film as recited in claim 1, further comprising the step of implanting impurity ions into said semiconductor substrate, using said patterned first insulating layer as a mask, prior to the formation of said second insulating layer.

5. A method of forming a sidewall insulating film as recited in claim 1, further comprising the step of implanting impurity ions into said semiconductor substrate after the formation of said sidewall insulating film, using said patterned first insulating layer and sidewall insulating film as masks.

6. A method of forming a sidewall insulating film, comprising the steps of:

forming a conductive layer having a thickness in the range of 1500 to 2500 Å on a semiconductor substrate;

forming a first insulating layer having a thickness in the range of 1500 to 2500 Å on said conductive layer;

forming a patterned mask layer in a region on said first insulating layer;

isotopically etching said first insulating layer until its thickness is reduced to ⅕ to ½ of its original thickness, using said mask layer as a mask;

exposing said conductive layer by anisotropically etching said first insulating layer, using said mask layer as mask;

anisotropically etching said conductive layer, using said mask layer or said patterned first insulating layer as a mask;

removing said mask layer;

forming a second insulating having a thickness in the range or 1500 to 4000 Å on the side plane of said conductive layer and on said first insulating layer on said semiconductor substrate; and leaving a sidewall insulating film on the side plane of said conductive layer by anisotropically etching said second insulating layer.

* * * * *